United States Patent [19]

Lai

[11] 4,386,152

[45] May 31, 1983

[54] PLASMA DEVELOPABLE ELECTRON RESIST PROCESS

[75] Inventor: Juey H. Lai, Burnsville, Minn.

[73] Assignee: Honeywell Inc., Minneapolis, Minn.

[21] Appl. No.: 275,553

[22] Filed: Jun. 19, 1981

[51] Int. Cl.$^3$ .............................................. G03C 5/24
[52] U.S. Cl. .................................... 430/269; 430/312; 430/313; 430/296
[58] Field of Search ............... 430/269, 312, 313, 314, 430/296

[56] References Cited

U.S. PATENT DOCUMENTS 4,126,466 11/1978 Roos .................................. 430/271
4,241,165 12/1980 Hughes et al. ...................... 430/269

OTHER PUBLICATIONS

"Plasma-Developed X-Ray Resists", Gary N. Taylor and Thomas M. Wolf, Bell Laboratories, Murray Hill, N.J., 07974.

"A Negative-Working Plasma-Developed Photoresist", Gary N. Taylor, Thomas M. Wolf, and Michael R. Goldrick, Bell Laboratories, Murray Hill, N.J., 07974.

*Primary Examiner*—John E. Kittle
*Assistant Examiner*—John L. Goodrow
*Attorney, Agent, or Firm*—Charles G. Mersereau

[57] ABSTRACT

A method of fabricating a negative electron resist pattern for microcircuit is disclosed which combines electron beam resist exposure with dry plasma etch developing. The technique utilizes a coating of a barrier polymer over the negative electron resist film prior to exposure to the electron beam film to prevent vacuum sublimation of the constituents of the negative electron resist film.

15 Claims, No Drawings

PLASMA DEVELOPABLE ELECTRON RESIST PROCESS

BACKGROUND OF THE INVENTION

1. Field of the Invention

The present invention relates generally to the field of radiation sensitive resist films used in microcircuit fabrication and, more particularly, to a dry plasma developable electron resist process for developing negative electron resists.

2. Description of the Prior Art

The application of electron beam techniques to the art of semiconductor fabrication has enabled great strides to be made in reducing the minimum line width and thus the size of a pattern which can successfully be manufactured. This has been accomplished both through progress in the technology involved with the perfection in the precision of the electron beam system itself and in the progress which has been made in the technology concerned with the pattern defining medium or resist material.

In electron beam microfabrication, a substrate, which may be, for example, silicon dioxide, silicon, glass or chromium plated glass, is further coated with a layer of polymer resist material and the resist is patterned by changing the solubility of the polymer with an electron beam. Subsequently, in accordance with prior art processes, the mask has heretofor been "developed" by dissolving away the unwanted area of polymer utilizing a suitable solvent material and the resultant pattern used as a mask either for plating, chemical etching, ion etching or ion implantation. Electron-beam lithography (EBL), then, is an integrated circuit production technique which utilizes a polymer resist to delineate circuit patterns for monolithic circuits.

Insofar as the solubility of the polymers is concerned, when polymers of the required type are irradiated with an electron beam, the molecular structure is affected such that some of the polymer molecules are excited or ionized by the beam. This excitation causes some of the resist molecules to cross-link with other molecules in the polymer structure and others to degrade or undergo scission. The predominant manner in which such a polymeric material reacts to exposure to an electron beam has led electron resists to be classified into two main categories. Thus, a polymer which becomes predominantly gelled or cross-linked, and thereby decreases its solubility after irradiation, is termed a negative resist. Conversely, if the scission process predominates and the solubility of the polymer increases after irradiation, it is called a positive resist. The resists developed by the process of the present invention are negative resists.

A suitable electron resist must have various physical and chemical properties which allow it to fulfill the requirements for electron beam fabrication. The polymer material involved must be sensitive to an electron current of a fairly low value or the resist sensitivity itself will be the limiting factor on the writing speed and line width which can be achieved. The resist medium must be capable of a high resolution or resist contrast compatible with that achieved in writing and etching techniques utilizing the high resolution capability available with electron beam technology. The resist must also have the ability to adhere satisfactorily to a variety of substrates used in different microfabricated applications. The medium also must be able to withstand normal acid, base, and plasma and ion etching processes and should not be sensitive to small daily process variabilities.

Negative electron resists are normally applied to the substrate by a spinning process, and, as previously stated, exposed using a high energy electron beam and spray developed with a suitable solvent. It is the solvent development step in the process which has been somewhat of a limiting factor in microcircuit fabrication utilizing this technique. Since the unexposed area has to be removed completely by the solvent, the solvent invariably penetrates into the exposed area to a certain extent thereby causing the swelling of the cross-linked polymer. The swelling of negative resist polymers associated with wet solvent development is a serious problem and has limited the degree of high resolution obtainable in negative resist pattern technology. In addition, the solvents utilized in the development are often quite toxic to those working with them and all are relatively costly.

In the prior art, dry process utilizing a gas plasma, preferably an oxygen plasma has been disclosed in the development of photoresist type films. One such process is illustrated and described in U.S. Pat. No. 4,241,165 to Hughes et al Dec. 23, 1980. Such photoresist material normally consists of a polymer binder, a vinyl aromatic monomer and a photoinitiator which, upon exposure to ultraviolet light decompose and initiate a polymerization reaction. While the process of that invention appears to work satisfactorily for such photoresist materials, the electron beam fabrication technique requires different material properties which makes photoresist materials unsuitable.

Dry process developable photoresists are not suitable for use in electron resist processes because the vinyl aromatic monomers which exist in the solid state at room temperature sublime or evaporate under the high vacuum required for electron beam lithography. To overcome this problem, electron resist materials normally must be further coated with a layer of barrier polymer to prevent sublimation of the resist material. In addition, resolution required for modern day microcircuit fabrication which is normally a resolution of less than one micron cannot be obtained utilizing photoresist materials. Thus, photoinitiated polymerization cannot be used because of optical limitations.

SUMMARY OF THE INVENTION

The present invention solves the problems associated with the development of negative electron resists utilizing liquid solvent materials by the provision of plasma developable electron resist process which uses a dry plasma method to develop high-resolution negative electron resist patterns. In the plasma developable electron resist process of the present invention, the negative electron resist, which normally consists of a vinyl polymer and a monomer which both exist in the solid state at room temperature are dissolved in a common solvent and spin coated on the substrate. The resist film is then vacuum dried at room temperature to remove the solvent and is subsequently coated with a barrier polymer film. The barrier polymer film is used to prevent the sublimation of monomer inside the vacuum chamber of an electron beam lithography system. The resist film is vacuum dried at room temperature in preparation for the electron beam exposure. It is then exposed to an electron beam which exposes the desired pattern subsequently to be utilized in the microcircuit fabrication.

After the electron beam exposure, the film of barrier polymer is removed and the resulting resist film is then baked to vaporize and remove monomers which are not polymerized in the exposure process. The resist then is placed in a barrel plasma etcher or planar plasma etcher to develop the exposed resist pattern without the use of any liquid solvents.

Monomer and base polymer combinations selected for the process must be ones in which, when exposed to a high energy electron beam, the monomer is spontaneously grafted to the base polymer and/or polymerized to form a homopolymer. The graft copolymer and the homopolymer in the exposed area must have a much lower plasma etch rate than that of the base polymer in the unexposed area such that the resist will be a negative-acting one which is plasma developable. Suitable monomers which have been utilized in the process of the present invention include such monomers as vinyl stearate, acrylamide, methacrylamide, N-t-butyl acrylamide, p-vinylacelanilide, N-vinylcarbazole and diphenylacetylene. While all these compounds are acceptable, the preferred embodiment utilizes diphenyl acetylene as the monomer.

Insofar as the base polymer is concerned, it should have a good film-forming characteristic, high glass transition temperature, should be compatible with the monomers with which it is used and should have low plasma etch resistance or high polymer etch rate such that uncombined base polymer can be easily removed in the plasma etcher. In this regard, most aliphatic vinyl polymers with high glass transition temperatures can be used. Of these, chlorine containing vinyl polymers including such compounds as poly(trichloroethylmethacrylate) and poly(methyl α-chloroacrylate) are preferred.

The barrier polymer is usually one soluble in a solvent which does not affect the monomer or base polymer, which does not affect the resist exposure process and which prevents sublimation of the resist components in a vacuum at room temperature during e-beam exposure. Such compounds include poly(vinyl alcohol) and poly(vinyl pyrolidone) which are water soluble.

DESCRIPTION OF THE PREFERRED EMBODIMENT

In accordance with the following examples, highly sensitive negative electron resists capable of submicron resolution are produced. Exposed resists exhibit excellent plasma etch resistance and have been specifically designed for plasma etch development in conjunction with electron beam lithography.

EXAMPLE I

A solution was prepared by mixing 2.8 grams of poly(trichloroethyl methacrylate) (PTCEM) with 1.4 grams of diphenylacetylene (DPAE) and dissolving the mixture in 20 ml of chlorobenzene. The molecular weight $\overline{M}_w$ (weight average molecular weight) of poly(trichloroethyl methacrylate) was 77,000. The solution was used to deposit a resist film having a thickness of about 1.0 μm on a 3 inch diameter $S_iO_2$ wafer by spin coating at 1000 rpm spin speed. The resist film contained 2:1 PTCEM/DPAE by weight. The film was then dried in a vacuum oven at room temperature for one and one-half hours. After drying, the wafer coated with the resist film was further coated with a thin layer (1.0 μm) poly(vinyl alcohol) (PVA) by spin coating using a water solution of PVA. The PVA solution was prepared by dissolving 1 g. of PVA (J. T. Baker, 8-U229) and 50 mg. of octylphenoxypolyethoxyethanol (Triton X-405 from Rohm and Haas) in deionized water.

After being coated with the PVA film, the resist film was dried at room temperature in a vacuum oven for an hour. The resist film was then exposed using an electron beam with a dose of $3 \times 10^{-5}$ Coulombs $cm^{-2}$ at 15 KV. After e-beam exposure, the resist film was dipped in deionized water at 45° C. for 30 seconds to remove the PVA barrier layer and then baked at 60° C. in vacuum for 30 minutes to remove remaining unexposed volatile monomer prior to plasma development of the resist patterns. The plasma development of resist patterns was performed in a barrel etcher using $O_2$ plasma without using a tunnel in the etcher. The plasma etching conditions were 100 watts of power and 0.5 torr of $O_2$ gas. The temperature inside the barrel etcher during the plasma development was maintained at less than 90° C. The development time was 20 minutes. The resist film thickness of the exposed area which remained after the plasma etch development step was 0.2 μm.

EXAMPLE II

A resist film was prepared and exposed according to the method described in Example I. After electron beam exposure and removal of barrier polymer film as in Example I, the resist film was baked at 80° C. in vacuum for 30 minutes. The resist pattern was then developed by the method described in Example I. The development time required was 14 minutes and the resist film thickness of the exposed area remaining after development was 0.25 μm.

EXAMPLE III

The resist film was prepared according to the method described in Example I and then exposed using an electron beam with a dose of $7 \times 10^{-5}$ Coulombs $cm^{-2}$. After e-beam exposure and removal of barrier polymer film, the resist film was then baked at 100° C. in a vacuum oven for 30 minutes and plasma developed according to the method described in Example I. The development time required was 21 minutes and the resist thickness of the exposed area which remained after development was 0.4 μm.

EXAMPLE IV 2.8 gm. of poly(trichloroethyl methacrylate) (PTCEM) was mixed with 1.4 gm. of diphenylacetylene (DPAE) and dissolved in 20 ml. of chlorobenzene to form a solution. The weight average molecular weight $\overline{M}_w$ of the PTCEM was 77000. The solution was used to spin coat a resist film having a thickness of about 1.3 μm on a 3 inch diameter $S_iO_2$ wafer by spin coating at 600 rpm spin speed. The resist film was then dried in a vacuum oven at room temperature for one and one-half hours. After drying, the resist film was then coated with a thin layer of poly(vinyl alcohol) film as described in Example I. The resist film was then dried and exposed using an electron beam with a dose of $25 \times 10^{-6}$ Coulomb $cm^{-2}$ at 15 KV. The exposed resist film was dipped into deionized water at 45° C. for 30 seconds and baked at 100° C. in vacuum for 30 minutes. The resist pattern was then developed in a barrel etcher using $O_2$ plasma as described in Example I. The resist film thickness remained after development was 0.3 μm. The development time was 21 minutes.

EXAMPLE V

The resist film was prepared, processed and developed according to the process described in Example 4 except that the resist film was exposed with an electron dose of $60 \times 10^{-6}$ Coulombs cm$^{-2}$. The resist film thickness after development was 0.53 μm and the plasma development time was 21 minutes.

The developed electron resist patterns used in accordance with the above-cited three examples produced excellent submicron resolution. Patterns produced in accordance with the present invention have proved superior to ones using prior resist patterns made utilizing the wet development process.

As discussed above, the resist films may be made from a variety of combinations or monomers, base polymers and, if necessary, barrier layers. In a negative electron beam resist of the present invention normally consists of three components, namely, a comonomer, a base polymer and a barrier layer.

Generally, the monomer must be one which, when exposed to high energy electrons, is spontaneously grafted to the base polymer or polymerizes to a homopolymer. The graft copolymer and the homopolymer must also have a lower plasma etch rate than that of the base polymer in order to produce a negative-acting plasma developable resist. The barrier polymer must be utilized as a coating on the top of the electron resist film if the monomer sublimates under high vacuum which is the case with the vast majority of those which are suitable. The base polymer is also needed to facilitate the deposition of the monomer film on the surface of the substrate and to aid in obtaining uniform resist film thickness. The choice of a monomer and a base polymer should be such that the ratio of the effective plasma etch rates of the unexposed and exposed areas is on the order of 4:1.

In addition to the above, the melting point of the monomer should be substantially higher than room temperature, i.e., the monomer must exist in the solid state at room temperature; the monomer must be fairly stable under vacuum at room temperature to reduce sublimation or vaporization of the monomer at room temperature under high vacuum. The monomer must also be soluble in organic solvents for spin coating. The most important requirement of all is, of course, that the e-beam induced polymers (from the monomer) must have high plasma etch resistance. While the preferred monomer is diphenylacetylene, other suitable monomers include vinyl stearate, methacrylamide, N-t-butyl acrylamide, p-vinyl acetanilide, N-vinylcarbazole.

The base polymer is needed as the backbone polymer which forms the reactive center for grafting the monomer, in graft copolymerization. The base polymer should have good film-forming characteristics, and a high glass transition temperature. It should be compatible with the monomers, and should be soluble in the solvent which is used to dissolve the monomer.

As previously discussed, an important issue concerning the plasma developable electron resist is the stability of the monomer under high vacuum. Some of these monomers, e.g. vinylcarbazole, sublime slowly under high vacuum at room temperature. A significant loss of the monomer in the vacuum prior to exposure will lead to the failure of the process. This is prevented by coating the thin (0.2 μm) barrier polymer layer on top of the electron resist film. While the preferred embodiment uses poly(vinyl alcohol), suitable polymer candidates for the protective coating are other water soluble polymers, e.g. poly(vinylpyrorridone) and polyacrylamide, which are also negative electron resists. To improve the wetting characteristics of the barrier polymer solution on the resist layer, a nonionic surface-active agent is added. In the examples of the illustrative embodiments the preferred material is octylphenoxy-polyethoxyethanol (Triton X-405) obtained from the Rohm & Haas Company. Of course, others having the required properties can also be used. Since the water is used as the solvent for both depositing and removing the protective or barrier polymer layers, the possibility of extracting or dissolving both the monomer and the base polymer by the water is non-existent.

The post-exposure bake step is designed to remove the volatile monomers from the unexposed area. This results in a thickness difference between the exposed and unexposed areas of the resist. The optimum bake temperature is one sufficiently elevated to sublimate most of the monomer molecules in the unexposed area but below the temperature at which thermally induced polymerization of the monomer occurs. This temperature is generally in the range of 70° C. to 110° C.

While good success has been achieved using a barrel etcher, the development of resist patterns can be performed in both a barrel etcher and a planar etcher. The plasma can be either oxygen or a mixture of $CF_4$ and $O_2$. The selection of the plasma and etcher should be such that the process maximizes the etch rate ratio between the exposed and unexposed areas. After relief bake, the exposed area contains the homopolymer, graft copolymer, and the base polymer, while the unexposed area contains only the binder. Thus, the selection of the composition of plasma gas should be such that it removes the base polymer much faster than the other polymers-homopolymer and graft copolymer.

The relief bake is designed to remove the volatile monomers from the unexposed area resulting in a thickness difference between the exposed and the unexposed areas. Since the volatile monomers which can be removed by a relief bake may also be sublimable in the vacuum chamber of the e-beam exposure system, a barrier polymer coated on the top of the resist layer may be required. Prior to relief bake, the barrier polymer must be removed to facilitate the sublimation of monomers in the unexposed area.

The embodiments of the invention in which an exclusive property or right is claimed are defined as follows:

1. A method of fabricating an electron resist pattern comprising the steps of applying a coating of a negative electron resist film material comprising a mixture of an aliphatic vinyl base polymer having a relatively high plasma etch rate and a monomer having a relatively low plasma etch rate to a substrate, said monomer being one selected from the group consisting of vinyl stearate, methacrylamide, N-t-butyl acrylamide, p-vinylacetanilide, N-vinylcarbazole and diphenylacetylene;

applying a coating of a barrier polymer film over said negative electron resist film to prevent vacuum sublimation of said monomer, wherein said barrier polymer is one which is soluble in a solvent which is not a solvent for said base polymer or said monomer;

exposing said negative electron resist film to an electron beam describing a predetermined pattern;

dissolving away said coating of barrier polymer;

baking said resist film prior to development thereof; and developing said exposed resist pattern by plasma etching.

2. The method according to claim 1 wherein said aliphatic vinyl base polymer contains chlorine.

3. The method according to claim 2 wherein said aliphatic vinyl base polymer is one selected from the group consisting of poly(trichloroethylmethacrylate) and poly(methyl α-chloroacrylate).

4. The method according to claim 3 wherein said aliphatic vinyl base polymer is poly(trichloroethylmethacrylate).

5. The method according to claim 4 wherein said monomer is diphenylacetylene.

6. The method according to any one of claims 1–3 wherein said barrier polymer coating is one which is water soluble.

7. The method according to any one of claims 1–3 wherein said barrier polymer is one selected from the group consisting of poly(vinyl alcohol) and, poly(vinylpyrroidone) and polyacrylamide.

8. The method according to claim 7 wherein said barrier polymer is poly(vinyl alcohol).

9. The method according to claim 1 further comprising the steps of:

drying said coating of said negative electron resist after application to said substrate; and drying said coating of said barrier polymer after application to said negative electron resist film.

10. The method according to claim 1 wherein said coating of said negative electron resist material is applied by spin coating from a suitable solvent.

11. The method according to claim 1 wherein said baking step after the removal of said barrier polymer is conducted at a temperature high enough to sublime said monomer but below the temperature at which thermal polymerization of the monomer will occur.

12. The method according to claim 1 wherein the etching agent in the plasma etching atmosphere is $O_2$.

13. The method according to claim 1 wherein the plasma etching agent in the plasma etching atmosphere comprises a mixture of $CF_4$ and $O_2$.

14. A method of fabricating an electron resist pattern comprising the steps of applying a coating of a negative electron resist film material comprising a mixture of an aliphatic vinyl base polymer having a relatively high plasma etch rate wherein said polymer is one selected from the group consisting of poly(trichloroethylmethacrylate) and poly(methyl α-chloroacrylate) and a monomer having a relatively low plasma etch rate wherein said monomer is one selected from the group consisting of vinyl stearate, methacrylamide, N-t-butyl acrylamide, p-vinylacetanilide, N-vinylcarbazole and diphenylacetylene;

drying said coated substrate;

applying a coating of a water soluble barrier polymer film containing a polymer selected from the group consisting of poly(vinyl alcohol) and, poly(vinylpyrroidone) and polyacrylamide over said negative electron resist film to prevent vacuum sublimation of said monomer;

drying said barrier layer;

exposing said negative electron resist film to an electron beam describing a predetermined pattern;

dissolving away said coating of barrier polymer;

baking said resist film prior to development thereof at a temperature high enough to sublime said monomer but below its thermal polymerization temperature, and developing said exposed resist pattern by plasma etching in an atmosphere containing $O_2$ or a mixture of $O_2$ and $CF_4$.

15. The method according to claim 14 wherein said base polymer is poly(trichloroethylmethacrylate), said monomer is diphenylacetylene, said barrier layer is poly(vinyl alcohol) and the etching agent in said plasma etching atmosphere is $O_2$.

* * * * *